US007041226B2

(12) United States Patent
Vaideeswaran et al.

(10) Patent No.: US 7,041,226 B2
(45) Date of Patent: May 9, 2006

(54) METHODS FOR IMPROVING FLOW THROUGH FLUIDIC CHANNELS

(75) Inventors: Karthik Vaideeswaran, Lexington, KY (US); Andrew L. McNees, Lexington, KY (US); John W. Krawczyk, Lexington, KY (US); James M. Mrvos, Lexington, KY (US); Cory N. Hammond, Winchester, KY (US); Mark L. Doerre, Lexington, KY (US); Jason T. Vanderpool, Lexington, KY (US); Girish S. Patil, Lexington, KY (US); Christopher J. Money, Lexington, KY (US); Gary R. Williams, Lexington, KY (US); Richard L. Warner, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 191 days.

(21) Appl. No.: 10/701,225

(22) Filed: Nov. 4, 2003

(65) Prior Publication Data

US 2005/0093912 A1 May 5, 2005

(51) Int. Cl.
*G01D 15/00* (2006.01)
*H01L 21/00* (2006.01)

(52) U.S. Cl. ............................................ 216/27; 438/8

(58) Field of Classification Search .................. 216/27, 216/37, 41–42, 46, 52, 92; 438/8, 745, 748–749, 438/759

See application file for complete search history.

(56) References Cited

U.S. PATENT DOCUMENTS

| | | | | |
|---|---|---|---|---|
| 5,563,640 | A | 10/1996 | Suzuki | |
| 5,705,089 | A | 1/1998 | Sugihara et al. | |
| 5,712,198 | A | 1/1998 | Shive et al. | |
| 5,865,900 | A | 2/1999 | Lee et al. | |
| 5,980,992 | A | 11/1999 | Kistner et al. | |
| 5,990,013 | A | 11/1999 | Berenguer et al. | |
| 6,074,040 | A | 6/2000 | Usui et al. | |
| 6,187,685 | B1 * | 2/2001 | Hopkins et al. | 438/710 |
| 6,194,326 | B1 | 2/2001 | Gilton | |
| 6,281,921 | B1 | 8/2001 | Sugaya et al. | |
| 6,435,660 | B1 | 8/2002 | Ozaki et al. | |
| 6,523,762 | B1 | 2/2003 | Luginbuhl et al. | |
| 6,531,068 | B1 * | 3/2003 | Laermer et al. | 216/37 |

(Continued)

FOREIGN PATENT DOCUMENTS

EP 0855372 7/1998

(Continued)

*Primary Examiner*—Lamson Nguyen
(74) *Attorney, Agent, or Firm*—Luedeka, Neely & Graham, P.C

(57) ABSTRACT

A method for improving fluidic flow for a microfluidic device having a through hole or slot therein. The method includes the steps of forming one or more openings through at least part of a thickness of a substrate from a first surface to an opposite second surface using a reactive ion etching process whereby an etch stop layer is applied to side wall surfaces in the one or more openings during alternating etching and passivating steps as the openings are etched through at least a portion of the substrate. Substantially all of the etch stop layer coating is removed from the side wall surfaces by treating the side wall surfaces using a method selected from chemical treatment and mechanical treatment, whereby a surface energy of the treated side wall surfaces is increased relative to a surface energy of the side wall surfaces containing the etch stop layer coating.

24 Claims, 4 Drawing Sheets

U.S. PATENT DOCUMENTS

| | | | |
|---|---|---|---|
| 6,569,343 | B1 | 5/2003 | Suzuki et al. |
| 6,660,175 | B1 * | 12/2003 | Kawamura et al. ........... 216/27 |
| 2002/0084290 | A1 | 7/2002 | Materna |
| 2003/0148634 | A1 | 8/2003 | Holzl et al. |

FOREIGN PATENT DOCUMENTS

| | | | |
|---|---|---|---|
| FR | 2747960 | | 10/1997 |
| JP | 08001950 | A | 9/1996 |
| JP | 2002103632 | A | 9/2002 |

* cited by examiner

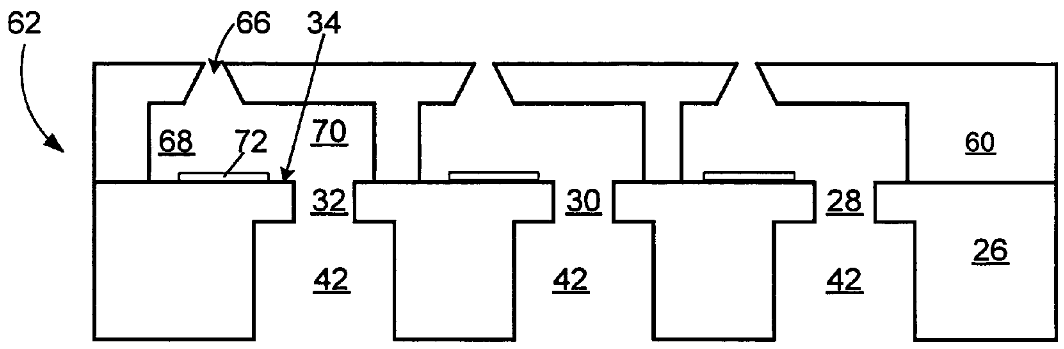
Fig. 8
Fig. 9
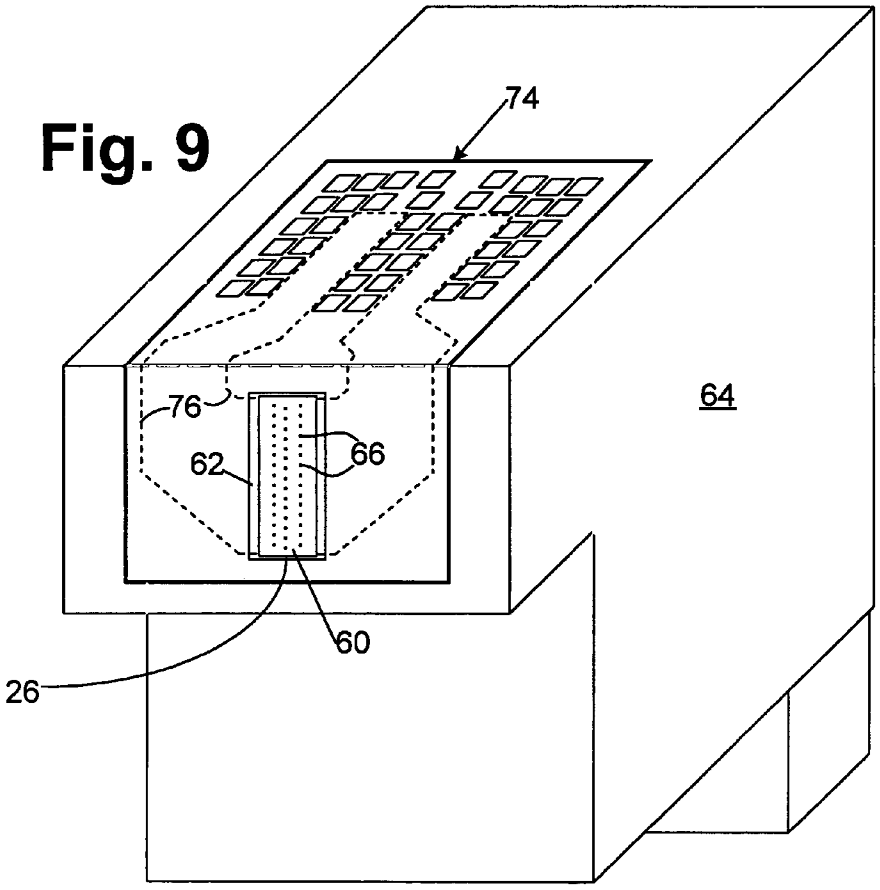

METHODS FOR IMPROVING FLOW THROUGH FLUIDIC CHANNELS

FIELD OF THE INVENTION

The invention is directed to micro-fluid ejecting devices and more specifically to structures and methods for improving fluid flow through openings in substrates for the micro-fluid ejecting devices.

BACKGROUND

Micro-fluid ejecting devices such as ink jet printers continue to be improved as the technology for making the printheads continues to advance. New techniques are constantly being developed to provide low cost, highly reliable printers which approach the speed and quality of laser printers.

One area of improvement in the printers is in the print engine or printhead itself. This seemingly simple device is a microscopic marvel containing electrical circuits, fluid passageways and a variety of tiny parts assembled with precision to provide a powerful, yet versatile component of the printer. The printhead components must also cooperate with an endless variety of ink formulations to provide the desired print properties. Accordingly, it is important to match the printhead components to the ink and the duty cycle demanded by the printer. Slight variations in production quality can have a tremendous influence on the product yield and resulting printer performance.

An ink jet printhead typically includes a semiconductor chip and a nozzle plate attached to the chip. The semiconductor chip is typically made of silicon and contains various passivation layers, conductive metal layers, resistive layers, insulative layers and protective layers deposited on a device surface thereof. Individual ink ejection devices such as heater resistors are defined in the resistive layers and each ink ejection device corresponds to a nozzle hole in the nozzle plate for ejecting ink toward a print media. In one form of a printhead, the nozzle plates contain ink chambers and ink feed channels for directing ink to each of the ink ejection devices on the semiconductor chip. In a center feed design, ink is supplied to the ink channels and ink chambers from a slot which is formed as by chemically etching or grit blasting through the thickness of the semiconductor chip. An alternative ink feed design includes individual ink feed holes formed through the thickness of the semiconductor chip as by a deep reactive ion etching (DRIE) technique such as is described in U.S. Pat. No. 6,402,301 to Powers et al.

As advances are made in print quality and speed, a need arises for an increased number of ink ejection devices which are more closely spaced on the silicon chips. Decreased spacing between the ink ejection devices requires more reliable ink feed techniques for ink supply to the ink ejection devices. As the complexity of the printheads continues to increase, there is also a need for long-life printheads which can be produced in high yield while meeting more demanding manufacturing tolerances. Thus, there continues to be a need for improved manufacturing processes and techniques which provide improved printheads and printhead components.

SUMMARY OF THE INVENTION

With regard to the above and other objects, the invention provides a method for improving fluidic flow for a microfluidic device having a through hole or slot therein. The method includes the steps of forming one or more openings through at least part of a thickness of a substrate from a first surface to an opposite second surface using a reactive ion etching process whereby an etch stop layer is applied to side wall surfaces in the one or more openings during alternating etching and passivating steps as the openings are etched through at least part of the thickness of the substrate. Substantially all of the etch stop layer coating is removed from the side wall surfaces by treating the side wall surfaces using a method selected from chemical treatment and mechanical treatment, whereby a surface energy of the treated side wall surfaces is increased relative to a surface energy of the side wall surfaces containing the etch stop layer coating.

In another aspect the invention provides a method for making a micro-fluid ejecting device. The method includes the steps of providing a semiconductor substrate having a thickness ranging from about 400 to about 900 microns and having a first surface and a second surface opposite the first surface. One or more fluid flow openings are micro-machined through the semiconductor substrate for fluid flow communication from the second surface to the first surface of the substrate. The one or more fluid flow openings include side wall surfaces having a first water contact angle greater than ninety degrees. The one or more fluid flow openings are then treated by a chemical treatment or mechanical treatment to provide one or more fluid flow openings having a second water contact angle less than about ninety degrees. A nozzle plate is attached to the semiconductor substrate to provide the micro-fluid ejecting device.

Another embodiment of the invention provides a silicon semiconductor substrate for an ink jet printhead. The substrate includes a first surface, a second surface opposite the first surface, and one or more ink feed ports therein extending from the first surface to the second surface. The one or more ink feed ports are formed, at least in part, by a reactive ion etching process and have side wall surfaces having a water contact angle of less than about ninety degrees for improved ink flow through the one or more ink feed ports.

An advantage of the invention is that fluid flow, particularly ink flow, through narrow channels in a micro-fluid ejecting device is significantly improved. Without desiring to be bound by theory, it is believed that a passivating or etch stop layer coating formed during a reactive ion etching process for making fluid flow channels in a silicon substrate lowers the surface energy of side wall surfaces of the fluid flow channels. The lower surface energy reduces the wettability of the side wall surfaces relative to the fluid flowing through the channels. As the wettability of the side wall surfaces decreases, the resistance to fluid flow through the channels is increased. Increased fluid flow resistance may contribute to reduced fluid flow to ejection chambers on a substrate for the micro-fluid ejecting device. Under high frequency operation, misfiring of the ejection device may result if the ejection chambers are not adequately refilled between fluid ejection cycles. By increasing the surface energy of the fluid flow channels, the invention improves fluid flow through the channels.

Additionally, fluid flow channels having relatively low surface energy are more likely to attract and hold air bubbles which can impede fluid flow through the channels. While not desiring to be bound by theory, it is believed that the invention reduces the accumulation of air bubbles in the fluid flow channels by increasing the surface energy of the fluid flow channels.

BRIEF DESCRIPTION OF THE DRAWINGS

Further advantages of the invention will become apparent by reference to the detailed description when considered in conjunction with the figures, which are not to scale, wherein like reference numbers indicate like elements through the several views, and wherein:

FIG. 8 is a cross-sectional view, not to scale, through a semiconductor substrate and nozzle plate for a printhead made according to the invention; and FIG. 9 is a perspective view, not to scale, of an ink cartridge containing a printhead made according to the invention.

DETAILED DESCRIPTION OF THE INVENTION

Figure 1:
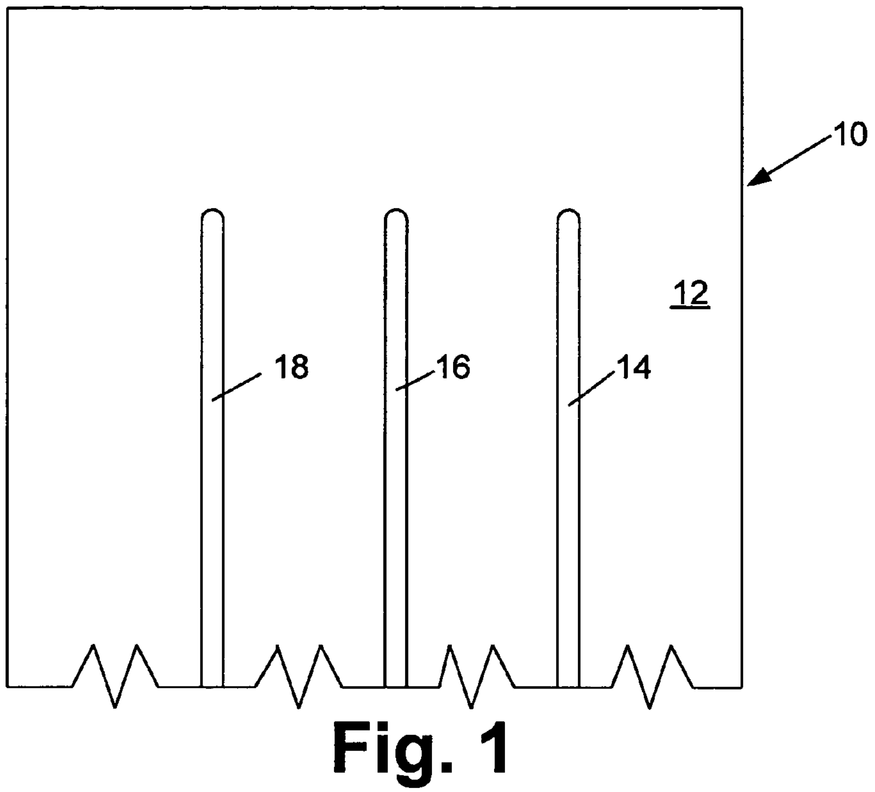
FIG. 1 is a plan view not to scale of a semiconductor chip for a micro-fluid ejecting device containing multiple fluid feed slots.
Figure 2:
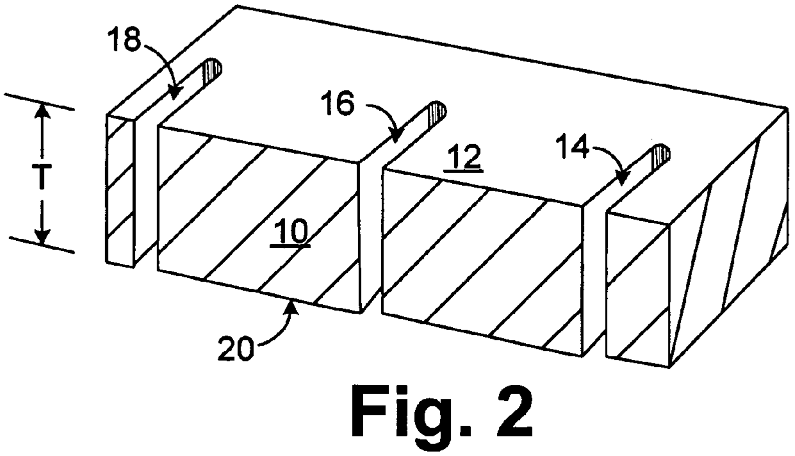
FIG. 2 is a perspective, cross-sectional view, not to scale, of a portion of a semiconductor chip for a micro-fluid ejecting device containing multiple fluid feed slots.

With reference to FIGS. 1 and 2, the invention provides a semiconductor silicon chip 10 for a micro-fluid ejecting device such as an ink jet printhead, having a device surface 12 and containing a plurality of openings or fluid feed slots 14, 16, and 18 therein. The semiconductor chip 10 is relatively small in size and typically has overall dimensions ranging from about 2 to about 10 millimeters wide by about 10 to about 36 millimeters long. A primary aspect of the invention relates to the dimensions and manufacturing process for the fluid feed slots 14, 16, and 18 through the chip 10.

In conventional semiconductor chips for ink jet printheads, slot-type ink feed ports are grit blasted in the chips. Such grit blasted ink via slots generally have dimensions of about 9.7 millimeters long and 0.39 millimeters wide. Accordingly, the conventional chips must have a width sufficient to contain the relative wide ink via while considering manufacturing tolerances, and sufficient surface area for heater resistors and electrical tracing to the heater resistors.

In semiconductor silicon chips 10 made according to the invention, the openings or fluid feed slots 14, 16, and 18 are preferably dimensioned to be relatively narrower than the fluid feed slots made in a semiconductor chip by a grit blasting process. Such fluid feed slots 14, 16, and 18, according to the invention, are preferably formed, at least in part, by a reactive ion etching process and preferably have dimensions of about 5500 microns long by about 185 microns wide and about 590 microns in depth. Thus, silicon substrates used to provide the semiconductor chips 10 preferably have a length ranging from about 10 to about 36 millimeters long by about 2 to about 4 millimeters wide for a chip having a single fluid feed slot 14 formed therein and by about 3 to about 6 millimeters wide for a chip 10 having three or four fluid feed slots formed therein. Reactive ion etched fluid feed slots 14, 16, and 18 enable use of a chip having a substantially reduced chip surface area required for the fluid flow slots, fluid ejection devices, and electrical tracing to the fluid ejection devices. Reducing the size of the chips 10 enables a substantial increase in the number of chips 10 that may be obtained from a single silicon wafer. Hence, the invention provides substantial incremental cost savings over chips having fluid feed slots made by conventional grit blasting techniques.

For the purposes of illustrating the invention, the fluid feed openings through the substrate 10 are shown as elongate slots 14, 16, and 18. However, the invention is not intended to be limited to elongate slots. The openings may be circular, oval or any other suitable shape for providing fluid flow to fluid ejection devices on the surface 12 of the substrate 10.

According to the invention, the fluid feed slots 14, 16, and 18 are etched through the entire thickness (T) of the semiconductor substrate 10 so that the slots 14, 16, and 18 connect a second surface 20 with the device surface 12 of the chip 10 as shown in FIG. 2. The fluid feed slots 14, 16, and 18 provide fluid communication between the device surface 12 of the substrate 10 and a fluid supply container, such as an ink cartridge, or remote fluid supply in fluid communication with the second surface 20 of the substrate 10. The fluid feed slots 14, 16, and 18 direct fluid from the fluid supply through the substrate 10 to ejection devices on the device surface 12 of the chip 10.

The invention is not intended to be limited to fluid feed slots 14, 16, and 18 dry etched through the entire thickness (T) of the semiconductor substrate 10. Accordingly, a hybrid process may be used to complete the fluid feed slots 14, 16, and 18. By hybrid process is meant a process that includes a reactive ion etching process for etching at least part way through the thickness (T) of the semiconductor substrate and a process selected from a wet chemical etch process and an abrasive blast process used to complete the fluid feed slots 14, 16, and 18 through the remaining thickness (T) of the substrate 10. Processes used to form the slots are referred to herein as "micromachining" processes.

Figure 4:
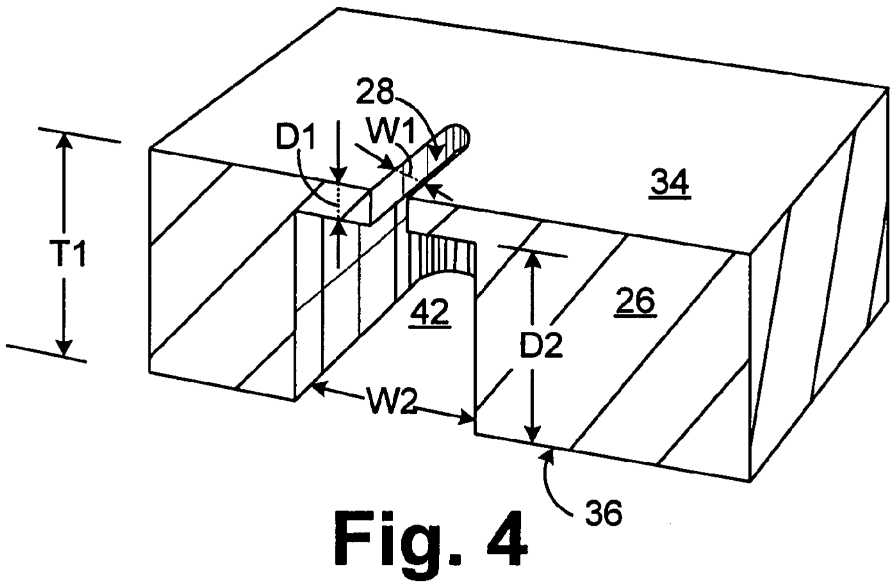
FIG. 4 is a perspective, cross-sectional view, not to scale, of a portion of a semiconductor chip according to another embodiment of the invention containing a fluid feed slot therein.
Figure 5:
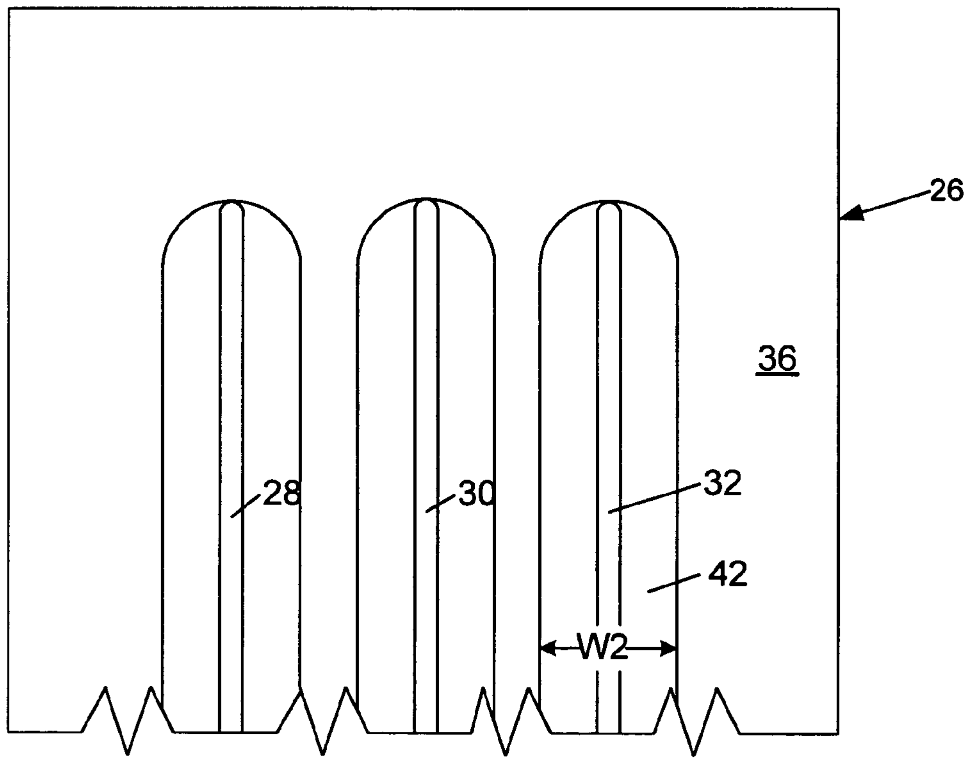
FIG. 5 is a plan view, not to scale, of an alternate semiconductor chip for a micro-fluid ejecting device containing multiple fluid feed slots as viewed from a second surface of the chip.

In FIGS. 1–2, the fluid feed slots 14, 16, and 18 preferably have a relatively constant width through the chip 10. An alternative chip 26 is illustrated in FIGS. 4–5. According to the alternative embodiment of the invention, fluid feed slots 28, 30, and 32 preferably have two widths (W1 and W2). For example, slot 28 preferably has a width (W1) extending from the device surface 34 to a depth (D1) through the thickness (T1) of the chip 26. Slot 28 also has a width (W2) that is greater than the width (W1) extending from a second surface 36 for a depth (D2) through the thickness (T1) of the chip 26. In a preferred embodiment, D2 is greater than D1.

For the purpose of simplifying the description, the formation of one fluid feed slot in chip 10, such as slot 14 will be described. However, the invention is applicable to forming one slot or multiples slots 14, 16, and 18 or 28, 30, and 32 in a silicon substrate 10 or 26.

A preferred method for forming at least a portion of the fluid feed slots, such as slot 14, for example, in a silicon semiconductor chip 10 is a dry etch technique, preferably a deep reactive ion etching (DRIE) process otherwise referred to as inductively coupled plasma (ICP) etching. Such dry etching technique employs an etching plasma comprising an etching gas derived from fluorine compounds such as sulfur hexafluoride ($SF_6$), tetrafluoromethane ($CF_4$) and trifluoroamine ($NF_3$). A particularly preferred etching gas is $SF_6$. A passivating gas is also used during the etching process to provide an etch stop layer coating on side wall surfaces as the opening is etched through the substrate. The passivating gas is derived from a gas selected from the group consisting of trifluoromethane ($CHF_3$), tetrafluoroethane ($C_2F_4$), hexafluoroethane ($C_2F_6$), difluoroethane ($C_2H_2F_2$), octofluorocyclobutane ($C_4F_8$) and mixtures thereof. A particularly preferred passivating gas is $C_4F_8$.

In order to conduct dry etching of fluid feed slots, such as the slot 14, in the silicon semiconductor chip 10, the chip 10 is preferably coated on the device surface 12 side thereof with a mask layer selected from $SiO_2$, a photoresist material, metal and metal oxides, i.e., tantalum, tantalum oxide and the like. Also, the chip 10 is preferably coated on the second surface 20 side with a protective layer or etch stop material selected from $SiO_2$, a photoresist material, tantalum, tantalum oxide and the like. The mask layer and/or protective layer may be applied to the silicon chip 10 by a thermal growth method, sputtering or spin coating. A photoresist material may be applied to the silicon chip 10 as a protective layer or mask layer by spin coating the photoresist material on the chip 26.

The fluid feed slot 14 may be patterned in the chip 10 from either side of the chip 10, the opposite side preferably being provided with an etch stop material or protective layer. For example, a photoresist layer may be applied as a mask layer on the device surface 12 of the chip 10. The mask layer is patterned to define the location of fluid feed slot 14 using, for example, ultraviolet light and a photomask. Once the slot location is defined, the reactive ion etching process is conducted to form the slot 14 through at least a portion of the thickness (T) of the chip 10.

In order to form the fluid feed slot 14 in the chip 10 according to the invention, the patterned chip 10 containing the etch stop layer or device layer and protective layer is placed in an etch chamber having a source of plasma gas and back side cooling such as with helium. It is preferred to maintain the silicon chip 10 below about 400° C., most preferably in a range of from about 50° to about 80° C. during the etching process. In the process, a deep reactive ion etch (DRIE) of the silicon is conducted using an etching plasma derived from $SF_6$ and a passivating plasma derived from $C_4F_8$ wherein the chip 26 is etched from the device surface 12 side toward the second surface 20 side.

Figure 3:
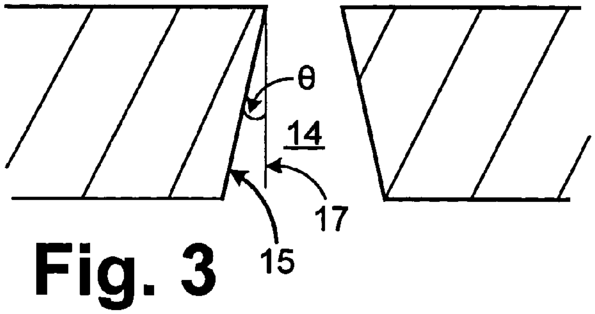
FIG. 3 is a cross-sectional view, not to scale, of a portion of a semiconductor chip containing a fluid feed slot therein.

During the process, the plasma is cycled between the passivating plasma step and the etching plasma step as the fluid feed slot 14 is etched through at least a portion of the chip 10 from the device surface 12 side to the second surface 20 side of the chip 10. Cycling times for each step preferably range from about 5 to about 20 seconds. Gas pressure in the etching chamber preferably ranges from about 15 to about 50 millitorrs at a temperature ranging from about −20° to about 35° C. The DRIE platen power preferably ranges from about 10 to about 300 watts and the coil power preferably ranges from about 800 watts to about 3.5 kilowatts at frequencies ranging from about 10 to about 15 MHz. Etch rates may range from about 2 to about 20 microns per minute or more and produce a fluid feed slot 14 having a side wall profile angle θ ranging from about 0° to about 10° between the side wall 15 and an axis 17 parallel with the slot as shown in FIG. 3. A more preferred side wall profile angle θ ranges from about 3° to about 8°, and most preferably from about 4° to about 5°. Etching apparatus is available from Surface Technology Systems, Ltd. of Gwent, Wales. Procedures and equipment for etching silicon are described in U.S. Pat. No. 6,051,503 to Bhardwaj, et al., U.S. Pat. No. 6,187,685 to Bhardwaj, et al., and U.S. Pat. No. 6,534,922 to Bhardwaj, et al.

When the etch stop layer is reached, etching of the feed slot 14 terminates. Slot 14 may be formed in the second surface 20 side of the chip 10 through the etch stop layer to complete the slot 14 in chip 10 as by blasting through the etch stop layer in the location of the fluid feed slot 14 using a high pressure water wash in a wafer washer. The finished chip 10 preferably contains a fluid feed slot 14 that is located in the chip 10 so that slot 14 is a distance ranging from about 40 to about 60 microns from its respective fluid ejection devices on the device surface 12 side of the chip 10.

In another embodiment, as shown in FIGS. 4–5, a wide trench 42 may be formed in the second surface 36 side of the chip 26 as by chemically etching the silicon substrate prior to or subsequent to forming fluid feed slots, such as slot 28, in the chip 26. It is preferred, however, to form the feed slot 28 before forming the wide trench 42. Chemical etching of trench 42 may be conducted, for example, using KOH, hydrazine, ethylenediamine-pyrocatechol-$H_2O$ (EDP) or tetramethylammonium hydroxide (TMAH) and conventional chemical etching techniques. In the preferred embodiment, prior to forming trench 42, fluid feed slot 28 is etched in the silicon chip 26 from the device surface 34 side of the chip 26 as described above to a depth ranging from about 1 to about 100 microns, preferably from about 50 to about 100 microns. Trench 42 may also be formed by DRIE etching of the chip 26 as described above.

The trench 42 is preferably provided in chip 26 to a depth (D2) of about 50 to about 300 microns or more. Upon completion of the feed slot 28 and trench 42, it is preferred to remove the protective layer from the chip 26. A preferred dry etching process is described in U.S. Pat. No. 6,402,301 to Powers et al., the disclosure of which is incorporated by reference as if fully set forth herein.

Figure 6:
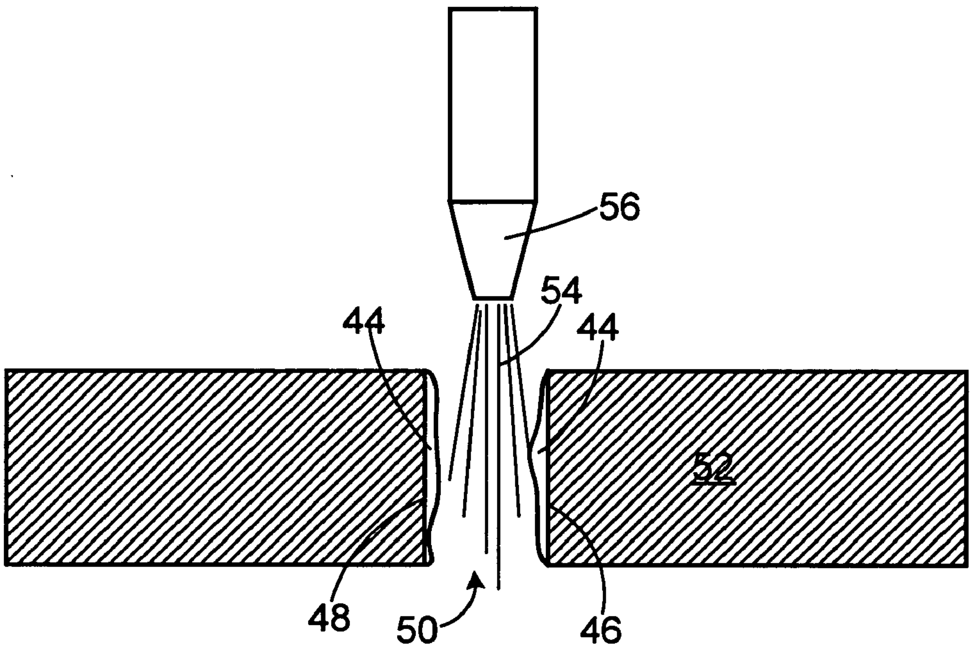
FIGS. 6–7 are a cross-sectional view, not to scale, of a silicon wafer containing a fluid feed slot and a process for decreasing a water contact angle of the fluid feed slot according to an embodiment of the invention.

As described above, during the dry etching process for forming at least a portion of the fluid feed slots 14, 16, and 18, or 28, 30, and 32, a passivating material is used in a process that includes cycling between a passivating plasma and an etching plasma. The passivating material deposits a passivating layer or etch stop layer, such as layer 44 on the side walls 46 and 48 of a fluid feed slot 50 in wafer 52 as shown in FIG. 6. It is believed that the passivating layer 44 decreases the surface energy and thus decreases the wettability of a fluid such as ink with respect to side walls 46 and 48 of the slot 50.

The surface energy of a surface such as side walls 46 and 48 is measured by measuring the water contact angle of the side wall surfaces of the side walls 46 and 48. A water contact angle of greater than ninety degrees indicates a relatively low surface energy or wettability of the surface. Water contact angles of from about 0° to about 90° indicate an increased surface energy and are preferred. More preferably the water contact angle ranges from about 0° to about 25°, and most preferably from about 0° to about 10°. The contact angle of a fluid such as ink may be lower than that of water since the surface tension of ink is about 40 dynes/cm whereas the surface tension of water is about 72 dynes/cm.

In order to increase the surface energy (decrease the water contact angle) of the fluid feed slot 50, a process selected from chemical and mechanical treatments is preferably used. According to a preferred chemical treatment process, a silicon wafer containing fluid feed slots therein formed by a dry etching process is washed or dipped in a solvent or mixture of solvents selected from perfluorinated alkanes, perfluorinated cycloalkanes, perfluorinated aromatics, perfluoropolyethers, fluorinated alkanes, fluorinated cycloalkanes, fluorinated aromatics, fluoroethers, fluoropolymer based etchants, sodium-ammonia based etchants, sodium-naphthalene based etchants, hydroxylamine based etchants, N-methyl pyrrolidone based etchants, organic nitroso solvent based etchants, dimethyl sulfoxide based etchants, organic aprotic solvent based etchants, perfluorinated compounds in the presence of supercritical carbon dioxide, and fluorinated compounds in the presence of supercritical carbon dioxide for a first period of time ranging from about 3 to about 5 minutes. A particularly preferred chemical treatment process includes the use of a perfluorinated alkane such as 3-ethoxy-1,1,1,2,3,4,4,5,5,6,6,6-dodecafluoro-2-trifluoromethyl-hexane available from 3M Company of St. Paul, Minn. under the trade name NOVEC HFE-7500.

After the chemical treatment step, the chemically treated wafer may optionally be thoroughly rinsed with a solvent selected from the group consisting of $C_1$ to $C_4$ alcohol, acetone, glycol ether, and ethers to remove substantially all of the perfluorinated compound from the side wall surfaces. A preferred solvent is a $C_1$ to $C_4$ alcohol, most preferably isopropyl alcohol. The wafer may be rinsed with the solvent by dipping the wafer in the solvent or spraying the solvent on the water. Rinsing the wafer may be conducted for a period of time ranging from about 4 to about 5 minutes or more.

Figure 7:
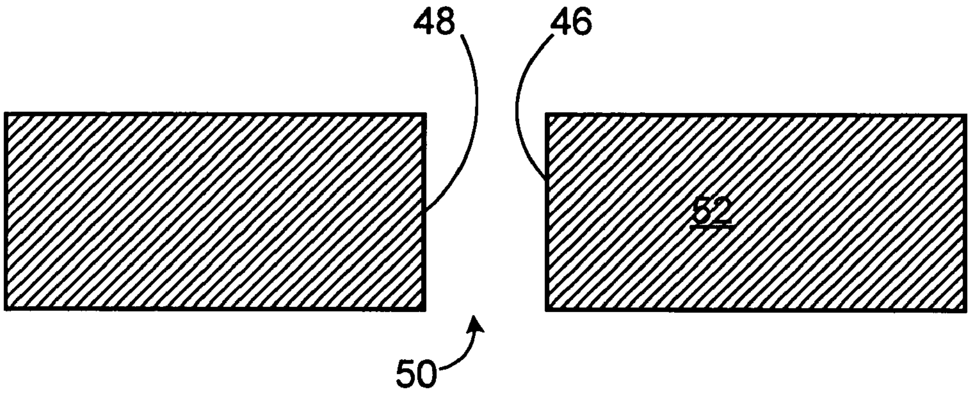

In addition to chemically treating the wafer, the wafer may optionally be heat treated after rinsing with the solvent or in lieu of rinsing with the solvent to evaporate the chemical treating solvent and/or rinsing solvent from the wafer. Heat treating may be conducted at an elevated temperature above room temperature. Heat treating is preferably conducted at a temperature ranging from about 160° to about 190° C. for a period of time ranging from about 10 to about 15 minutes. Highly volatile chemical treating solvents may not require the heat treating step or the heat treating step may be conducted at lower temperatures. A wafer 52 having the passivating layer 44 removed from the side walls 46 and 48 thereof is shown in FIG. 7.

In the alternative, a mechanical treatment process may be used to increase the surface energy of the feed slots. A preferred mechanical treatment method for removing passivating layer 44 includes the use of high pressure water jets or the use of an abrasive air puff blast through the fluid feed slot 50 in wafer 52 as shown in FIG. 6. An abrasive such as glass beads, sodium bicarbonate, aluminum oxide, or silicon carbide may be used in the abrasive air puff blast process. The amount of abrasive in an air stream 54, the amount of time the abrasive air stream 54 is directed at the fluid feed slot 50, the height of a nozzle 56 above the wafer 52 for directing the abrasive stream 54 in the slot 50, and the pressure of the abrasive air stream 54 are all predetermined to produce no significant damage or distortion to the fluid feed slot 50 during the passivating layer removal process.

Other treatment methods for increasing the surface energy of the fluid feed slot 50 include, but are not limited to, oxygenating the passivating layer with plasma or ozone treatments in a treatment chamber, exposing the wafer to fluorinated plasmas such as $SF_6$ or ion bombardment, exposing the wafer to a focused ion beam, exposing the wafer to ultrasonic cleaning in the presence or absence of a solvent, exposing the wafer to a laser beam such as provided by a YAG laser, and exposing the wafer to pyrolysis or other high temperature treatment.

In order to demonstrate the invention, a plain silicon wafer having a fluoropolymer passivation layer was treated according to the invention. The wafer had an ink contact angle of 25° before the passivation layer was applied to the wafer. After applying the passivation layer to the wafer, the ink contact angle was 110°. The wafer was then treated by dipping the wafer in NOVEC HFE-7500 solvent from 3M Company for about 4 minutes. Next the wafer was rinsed with isopropyl alcohol for about 5 minutes, then baked at about 175° C. for about 15 minutes. The ink-contact angle after chemical treatment, solvent rinse, and heat treatment was 30°.

After forming the fluid feed slots 28, 30, and 32 in the chip 26 and treating the fluid feed slots 28, 30, and 32 as by the chemical or mechanical treatment method described above, a nozzle plate 60 (FIG. 7) is attached to the device surface 34 side of the chip 26 preferably by use of one or more adhesives such as an adhesive which may be a UV-curable or heat curable epoxy material to provide a micro-fluid ejecting device 62. A preferred adhesive is a heat curable adhesive such as a B-stageable thermal cure resin, including, but not limited to phenolic resins, resorcinol resins, epoxy resins, ethylene-urea resins, furane resins, polyurethane resins and silicone resins. The adhesive is preferably cured before attaching the micro-fluid ejecting device 62 to a cartridge body 64 (FIG. 9). A particularly preferred adhesive is a phenolic butyral adhesive which is cured by heat and pressure.

The nozzle plate 60 contains a plurality of nozzle holes 66 each of which are in fluid flow communication with an fluid chamber 68 and an fluid supply channel 70 which are formed in the nozzle plate 60 material by means such as laser ablation. Alternatively fluid supply channels 70 and fluid chambers 68 may be formed independently of the nozzle plate 60 in a layer of photoresist material applied to the device surface 34 of the chip 26 and patterned by methods known to those skilled in the art.

The nozzle plate 60 and semiconductor chip 26 are preferably aligned optically so that the nozzle holes 66 in the nozzle plate 60 align with fluid ejection devices, such as heater resistors 72 on the semiconductor chip 26. Misalignment between the nozzle holes 66 and the heater resistors 72 may cause problems such as misdirection of fluid droplets from the micro-fluid ejecting device 62, inadequate droplet volume or insufficient droplet velocity. Accordingly, nozzle plate/chip assembly 60/26 alignment is critical to the proper functioning of the micro-fluid ejecting device 62. As seen in FIG. 8, the fluid feed slots 28, 30, and 32 are also preferably aligned with the fluid channels 70 so that the fluid is in flow communication with the fluid feed slots 28, 30, and 32, channels 70, and fluid chambers 68.

After attaching the nozzle plate 60 to the chip 26, the micro-fluid ejecting device 62 is electrically coupled to a flexible circuit or TAB circuit 74 using a TAB bonder or wires to connect electrical traces 76 on the flexible or TAB circuit 74 with connection pads on the semiconductor chip 26. Subsequent to curing the adhesive used to attach the nozzle plate 60 to the chip 26, the micro-fluid ejecting device 62 is attached to the cartridge body 64 (FIG. 9) using preferably a die bond adhesive.

The die bond adhesive used to attach the micro-fluid ejecting device 62 to the cartridge body 64 is preferably an epoxy adhesive such as a die bond adhesive available from Emerson & Cuming of Monroe Township, N.J. under the trade name ECCOBOND 3193-17. In the case of a thermally conductive cartridge body 64, the die bond adhesive is preferably a resin filled with thermal conductivity enhancers such as silver or boron nitride. A preferred thermally conductive die bond adhesive 50 is POLY-SOLDER LT available from Alpha Metals of Cranston, R.I. suitable die bond adhesive containing boron nitride fillers is available from Bryte Technologies of San Jose, Calif. under the trade designation G0063.

Once the micro-fluid ejecting device 62 is attached to the cartridge body 64, the flexible circuit or TAB circuit 74 is attached to the cartridge body 64 using a heat activated or pressure sensitive adhesive. Preferred pressure sensitive adhesives include, but are not limited to phenolic butyral adhesives, acrylic based pressure sensitive adhesives such as AEROSET 1848 available from Ashland Chemicals of Ashland, Ky. and phenolic blend adhesives such as SCOTCH WELD 583 available from 3M Corporation of St. Paul, Minn.

In order to control the ejection of a fluid such as ink from the nozzle holes 66 on the micro-fluid ejecting device 62, each semiconductor chip 26 is electrically connected to an ejection device controller in a device such as a printer to which the cartridge body 64 is attached. Connections between the controller and the fluid ejecting devices 72 are provided by the electrical traces 76 which terminate in contact pads in the device surface 34 side of the chip 26.

During a fluid ejection operation such as printing with an ink, an electrical impulse is provided from the controller to activate one or more of the ink ejection devices 72 thereby forcing fluid in fluid chamber 68 through nozzles holes 66 toward a media. Fluid is caused to refill the fluid channel 70 and fluid chamber 68 by capillary action. The fluid flows from a fluid supply in cartridge 64 through the fluid feed slots 28, 30, and 32 in the chip 26.

Fluid feed slots formed by conventional grit blasting techniques typically range from 2.5 mm to 30 mm long and 120 microns to 1 mm wide. The tolerance for grit blast fluid feed slots is ±60 microns. By comparison, fluid feed slots or fluid feed holes formed according to the invention may be made as small as 10 microns long and 10 microns wide. There is virtually no upper limit to the length of a fluid feed slot that may be formed by DRIE techniques. The tolerance for DRIE formed fluid feed slots is about ±10 to about ±15 microns. Any shape fluid feed slot may be made using DRIE techniques according to the invention including round, square, rectangular and oval shaped fluid feed slots. Furthermore, the fluid feed slots may be etched from either side of the chip using DRIE techniques according to the invention. A large number of fluid feed slots may be made at one time rather than sequentially as with grit blasting techniques and at a much faster rate than with wet chemical etching techniques As compared to wet chemical etching, the dry etching techniques according to the invention may be conducted independent of the crystal orientation of the silicon chip and thus may be placed more accurately in the chips. While wet chemical etching is suitable for chip thickness of less than about 200 microns, the etching accuracy is greatly diminished for chip thicknesses greater than about 200 microns. The gases used for DRIE techniques according to the invention are substantially inert whereas highly caustic chemicals are used for wet chemical etching techniques. The shape of the fluid feed slots made by DRIE is essentially unlimited whereas the fluid feed slot shape made by wet chemical etching is dependent on crystal lattice orientation. For example in a (100) silicon chip, KOH will typically only etch squares and rectangles without using advance compensation techniques. The crystal lattice does not have to be aligned for DRIE techniques according to the invention.

It will be recognized by those skilled in the art, that the invention described above may be applicable to a wide variety of micro-fluid ejection devices other than ink jet printing devices. Such micro-fluid ejection devices may include liquid coolers for electronic components, micro-oilers, pharmaceutical delivery devices, and the like.

Having described various aspects and embodiments of the invention and several advantages thereof, it will be recognized by those of ordinary skills that the invention is susceptible to various modifications, substitutions and revisions within the spirit and scope of the appended claims.

What is claimed is:

1. A method for improving fluidic flow for a microfluidic device having a through hole or slot therein, the method comprising the steps of:

forming one or more openings through at least part of a thickness of a substrate from a first surface to an opposite second surface using a reactive ion etching process whereby an etch stop layer is applied to side wall surfaces in the one or more openings during alternating etching and passivating steps as the openings are etched through at least part of the thickness of the substrate; and removing substantially all of the etch stop layer coating from the side wall surfaces by treating the side wall surfaces using a method selected from chemical treatment and mechanical treatment, whereby a surface energy of the treated side wall surfaces is increased relative to a surface energy of the side wall surfaces containing the etch stop layer coating.

2. The method of claim 1 wherein the reactive ion etching process comprises deep reactive ion etching using an etch stop layer derived from a fluorinated $C_2$ to $C_4$ compound.

3. The method of claim 1 wherein the treating method comprises a mechanical treatment selected from the group consisting of a puff grit blast treatment and a water blast treatment.

4. The method of claim 1 wherein the treating method comprises a treatment selected from the group consisting of plasma or ozone treatments in a treatment chamber, exposing the openings to a focused ion beam, exposing the openings to a laser beam, and ultrasonically cleaning the openings.

5. The method of claim 1 wherein treating method comprises chemical treatment and the chemical treatment includes contacting the side wall surfaces of the substrate with a perfluorinated compound for a first period of time sufficient to remove sufficient etch stop layer coating on the side wall surfaces to provide a water contact angle of less than about ninety degrees.

6. The method of claim 5 further comprising rinsing the side wall surfaces of the substrate with a solvent selected from the group consisting of $C_1$ to $C_4$ alcohol, acetone, glycol ether, and ethers to remove substantially all of the perfluorinated compound from the side wall surfaces.

7. The method of claim 6 further comprising heat treating the solvent rinsed substrate at an elevated temperature above room temperature.

8. The method of claim 5 further comprising heat treating the chemically treated substrate at an elevated temperature above room temperature.

9. The method of claim 5 wherein the perfluorinated compound comprises a compound selected from the group consisting of perfluorinated alkanes, perfluorinated cycloalkanes, perfluorinated aromatics, and perfluoropolyethers.

10. The method of claim 1 wherein the treating method comprises chemical treatment and the chemical treatment includes contacting the side wall surfaces of the substrate with a fluorinated compound for a first period of time sufficient to remove sufficient etch stop layer coating on the side wall surfaces to provide a water contact angle of less than about ninety degrees.

11. The method of claim 10 further comprising rinsing the side wall surfaces of the substrate with a solvent selected from the group consisting of $C_1$ to $C_4$ alcohol, acetone, glycol ether, and ethers to remove substantially all of the fluorinated compound from the side wall surfaces.

12. The method of claim 11 further comprising heat treating the solvent rinsed substrate at an elevated temperature above room temperature for from about 10 to about 15 minutes.

13. The method of claim 10 further comprising heat treating the chemically treated substrate at an elevated temperature above room temperature for a second period of time.

14. The method of claim 10 wherein the fluorinated compound comprises a compound selected from the group consisting of fluorinated alkanes, fluorinated cycloalkanes, fluorinated aromatics, and fluoroethers.

15. An ink jet printhead chip made by the method of claim 1.

16. A method for making a micro-fluid ejecting device comprising the steps of:

providing a semiconductor substrate having a thickness ranging from about 400 to about 900 microns and having a first surface and a second surface opposite the first surface;

micromachining one or more fluid flow openings through the semiconductor substrate for fluid flow communication from the second surface to the first surface of the substrate, the one or more fluid flow openings including side wall surfaces having a first water contact angle greater than ninety degrees;

treating the one or more fluid flow openings to provide one or more fluid flow openings having a second water contact angle less than ninety degrees; and attaching a nozzle plate to the semiconductor substrate to provide the micro-fluid ejecting device.

17. The method of claim 16 wherein the treating step comprises treating the fluid flow openings with a method selected from chemical treatment and mechanical treatment.

18. The method of claim 17 wherein the treating step comprises mechanical treatment selected from the group consisting of a puff grit blast treatment and a water blast treatment.

19. The method of claim 17 wherein the treating step comprises a treatment selected from the group consisting of plasma or ozone treatments in a treatment chamber, exposing the openings to a focused ion beam, exposing the openings to a laser beam, and ultrasonically cleaning the openings.

20. The method of claim 17 wherein the treating step comprises chemical treatment and the chemical treatment includes contacting at least side wall surfaces of the one or more fluid flow openings with a fluorinated or perfluorinated compound for a first period of time.

21. The method of claim 20 wherein the perfluorinated compound comprises a compound selected from the group consisting of fluorinated alkanes, fluorinated cycloalkanes, fluorinated aromatics, fluoroethers, perfluorinated alkanes, perfluorinated cycloalkanes, perfluorinated aromatics, and perfluoropolyethers.

22. The method of claim 20 further comprising rinsing the fluid flow openings with a solvent selected from the group consisting of $C_1$ to $C_4$ alcohol, acetone, glycol ether, and ethers to remove substantially all of the perfluorinated or fluorinated compound from the side wall surfaces of the fluid flow openings.

23. The method of claim 22 further comprising heat treating the semiconductor substrate for a second period of time at an elevated temperature above room temperature.

24. The method of claim 20 further comprising heat treating the semiconductor substrate for a second period of time at an elevated temperature above room temperature.

* * * * *